(12) United States Patent
Maier

(10) Patent No.: US 12,284,749 B2
(45) Date of Patent: Apr. 22, 2025

(54) POWER MODULE WITH HOUSED POWER SEMICONDUCTORS FOR CONTROLLABLE ELECTRICAL POWER SUPPLY OF A CONSUMER, AND METHOD FOR PRODUCING SAME

(71) Applicant: ZF Friedrichshafen AG, Friedrichshafen (DE)

(72) Inventor: Thomas Maier, Neunburg v. Wald (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 353 days.

(21) Appl. No.: 17/778,936

(22) PCT Filed: Nov. 23, 2020

(86) PCT No.: PCT/EP2020/083000
§ 371 (c)(1),
(2) Date: May 23, 2022

(87) PCT Pub. No.: WO2021/105028
PCT Pub. Date: Jun. 3, 2021

(65) Prior Publication Data
US 2022/0418088 A1    Dec. 29, 2022

(30) Foreign Application Priority Data

Nov. 25, 2019    (DE) .................... 10 2019 218 157.0
Nov. 25, 2019    (DE) .................... 20 2019 106 541.9

(51) Int. Cl.
*H05K 1/02* (2006.01)
*H05K 1/18* (2006.01)
(Continued)

(52) U.S. Cl.
CPC ......... *H05K 1/0209* (2013.01); *H05K 1/0256* (2013.01); *H05K 1/181* (2013.01);
(Continued)

(58) Field of Classification Search
CPC .... H05K 1/0209; H05K 1/0256; H05K 1/181; H05K 3/284; H05K 3/303; H05K 3/3415;
(Continued)

(56) References Cited

U.S. PATENT DOCUMENTS

2003/0198022 A1    10/2003    Ye et al.
2003/0222126 A1    12/2003    Morozumi et al.
(Continued)

FOREIGN PATENT DOCUMENTS

DE    60307157 T2    12/2006
DE    10196942 B4    9/2009
(Continued)

OTHER PUBLICATIONS

Search Report in Corresponding German Application No. 10 2019 218 157.0, dated Oc. 15, 2020 (14 pages).
(Continued)

*Primary Examiner* — Andargie M Aychillhum
(74) *Attorney, Agent, or Firm* — Crowell & Moring LLP

(57) ABSTRACT

A power module for the controllable electrical power supply of a consumer includes a plurality of housed power semiconductors each with an electrically non-insulated heat discharge surface, a printed circuit board, a heat sink, one or more insulation plates, wherein the printed circuit board is arranged on a side of the power semiconductor in an orthogonal direction opposite the heat sink, wherein the insulation plate is arranged between the housed power semiconductors and a cooling surface of the heat sink, wherein one insulation plate in each case is interlockingly connected by one side to one electrically non-insulated heat (Continued)

discharge surface of a housed power semiconductor and is interlockingly connected by the other side to the heat sink.

12 Claims, 3 Drawing Sheets

(51) Int. Cl.
  *H05K 3/28* (2006.01)
  *H05K 3/30* (2006.01)
  *H05K 3/34* (2006.01)
(52) U.S. Cl.
  CPC ............. *H05K 3/284* (2013.01); *H05K 3/303* (2013.01); *H05K 3/3415* (2013.01); *H05K 2201/066* (2013.01); *H05K 2201/09545* (2013.01); *H05K 2201/10166* (2013.01); *H05K 2201/10977* (2013.01)
(58) Field of Classification Search
  CPC ... H05K 2201/066; H05K 2201/10166; H05K 2201/10977
  USPC ......................................................... 174/252
  See application file for complete search history.

(56) References Cited

U.S. PATENT DOCUMENTS

| 2012/0175755 | A1  | 7/2012  | Bayerer |
| 2015/0332982 | A1* | 11/2015 | Ono ....................... H01L 23/296 |
| | | | 257/676 |
| 2016/0211189 | A1* | 7/2016  | Niessner ............... H01L 21/563 |
| 2016/0312097 | A1  | 10/2016 | Kitada et al. |

FOREIGN PATENT DOCUMENTS

| DE | 10 2014 102899 A1 | 9/2014 |
| DE | 10 2018 205 243 A1 | 10/2019 |
| EP | 2458632 A1 | 5/2012 |
| WO | WO 02/099878 A1 | 12/2002 |
| WO | WO 2021/105028 A1 | 6/2021 |

OTHER PUBLICATIONS

International Search Report and Written Opinion of the International Search Authority dated Feb. 15, 2021 in International Application No. PCT/EP2020/083000 (English and German Languages) (10 pages).

\* cited by examiner

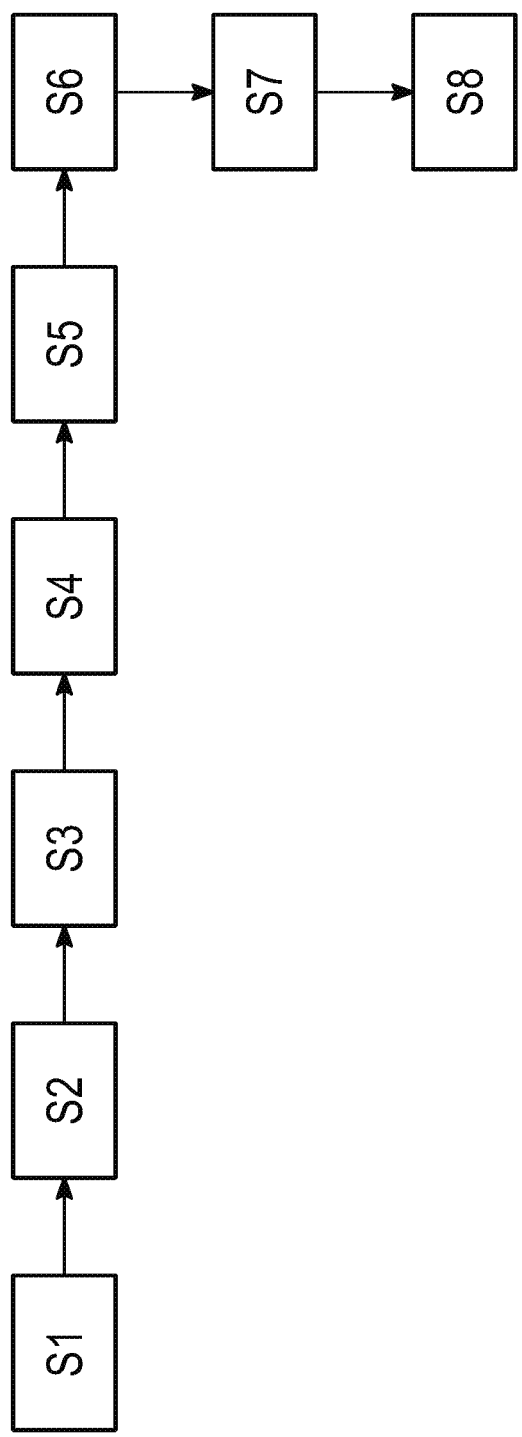

POWER MODULE WITH HOUSED POWER SEMICONDUCTORS FOR CONTROLLABLE ELECTRICAL POWER SUPPLY OF A CONSUMER, AND METHOD FOR PRODUCING SAME

CROSS-REFERENCE TO RELATED APPLICATIONS

This application is a U.S. national stage application under 35 U.S.C. § 371 of PCT Application No. PCT/EP2020/083000, filed on Nov. 23, 2020, and published as WO 2021/105028 A1 on Jun. 3, 2021, which claims priority from German Application No. DE 10 2019 218 157.0, filed on Nov. 25, 2019, and German Application No. DE 20 2019 106 541.9, filed on Nov. 25, 2019, the entirety of which are each hereby fully incorporated by reference herein.

The invention relates to a power module with housed power semiconductors for controllable electrical power supply of a consumer, and to a production method for a power module.

Power modules are used to supply consumers such as electric motors, for example, with a power which is necessary for their operation in a controllable manner. Power modules of this type are also sometimes referred to as inverters, transformers or AC converters.

Power modules can, for example, be used to provide electrical power in a vehicle from a battery to an electric motor serving as a drive in a controlled manner. In this case, the controllable power supply can range from a few kilowatts to several 100 kW.

The power modules usually possess power semiconductor components (hereinafter referred to as "power semiconductors" for short) for this purpose, for example in the form of IGBTs (insulated-gate bipolar transistor), SiCs (power modules with silicone carbide MOSFETs) or power MOSFETS which are controlled by a control circuit.

In the case of conventional power modules, IGBTs or SiC chips are applied, i.e. soldered or sintered, for example, onto a so called DCB (direct copper bonded), i.e. a structure which enables a tight electrical and thermal connection of electronic components and chips via copper. The DCB can then be sintered or soldered onto a copper plate with a cooling structure, for example. The entire structure can then be molded in a media-tight manner.

Alternatively, in the case of conventional power modules, IGBT components are mounted on a heat sink via a so called thermal interface material, such as a foil or a thermally conductive paste, for example. Alternatively, an electrically insulated housing of components of this type can be soldered or sintered directly onto the heat sink. An electrical connection takes place in this case for example by welding onto a punched grid or by soldering the components to a printed circuit board via a through-hole technique.

In the German patent application DE 10 2019 206 523.6, which has not been pre-published, a power module is described in which the heat dissipation surface, also referred to as an "exposed pad", of a housed power semiconductor is applied to a heat sink. One disadvantage in this case is that it is necessary to electrically insulate the heat dissipation surface of the housed power semiconductor before it can be connected to the heat sink in a thermal manner. This electrical insulation usually takes place circuit-electrically inside the power semiconductor, whereby the structure of the power semiconductor is complex and therefore costly.

The object of the invention is thus to specify an alternative power module with non-electrically insulated power semiconductors. One further object is specifying a production method for a power module of this type.

These objects can be achieved by the subject matter of the independent claims. Further embodiments of the invention are set forth in the dependent claims and in the following description.

One aspect of the invention relates to a power module for controllable electrical power supply of a consumer. In this case, the power module has a plurality of housed power semiconductors with an electrically non-insulated heat dissipation surface, a printed circuit board, a heat sink and one or a plurality of insulation plates in each case. The printed circuit board is arranged on a side of the power semiconductors which is opposite to the heat sink in an orthogonal direction. The insulation plates are arranged between the housed power semiconductors and a cooling surface of the heat sink. One insulation plate in each case is connected with one side to a respective electrically non-insulated heat dissipation surface of a housed power semiconductor in a form-fitting manner and is connected with the other side to the heat sink in a form-fitting manner.

Of course, it is also possible that the heat dissipation surfaces of a plurality of housed power semiconductors are connected to a common insulation plate.

Since in the case of power semiconductors a part of the conducted electrical power always results in heating of the power semiconductors in the form of losses, the housed power semiconductors possess, as already described previously, a heat dissipation surface on an outer side. A heat dissipation surface of this type is also sometimes referred to as an "exposed pad". The heat dissipation surface can be designed as a layer or plate, integrated in the housed power semiconductor and exposed on a surface, made of a good thermally conductive material, such as a metal, for example, in particular copper. In the present invention, these heat dissipation surfaces are not electrically insulated.

In the overall design concept described here for a power module, each of the housed power semiconductors is connected to a cooling surface of the heat sink via an insulation plate in a thermal manner. For this purpose, the heat dissipation surface of the power semiconductor contacts the insulation plate which, in turn, contacts the cooling surface of the heat sink in a thermally well conducting manner. In this case, the insulation plate can be made of a ceramic and has a metallization on a side facing the power semiconductor and likewise a metallization on a side facing the heat sink. In this case, the power semiconductor is applied to the insulation plate on one side in a form-fitting manner, for example by means of soldering, sintering, gluing. Furthermore, the insulation plate is applied to the heat sink on another side, for example by means of soldering, sintering, gluing.

This makes it possible to achieve an optimum form-fitting connection between, on the one hand, the heat dissipation surface of the power semiconductor and the insulation plate and, on the other hand, the insulation plate and the heat sink. As a result, an electrical insulation is achieved between the heat dissipation surface of the power semiconductor and the heat sink with optimum thermal connection at the same time.

In order to be able to discharge heat from the power semiconductors, the power module possesses, as described previously, a heat sink. This heat sink can be a metal plate, for example, in particular a copper plate. The heat sink may optionally possess an integrated cooling structure, such as cooling fins, for example. The heat sink can be cooled in a passive manner, for example by radiation exchange and/or heat exchange with an ambient medium. Alternatively, the heat sink can be cooled in an active manner, for example by a cooling medium flowing through it.

In the concept proposed here, the printed circuit board of the power module is arranged on a side of the power semiconductors which is opposite in the orthogonal direction to the side on which the heat sink is arranged. In other words, the heat sink can, for example, be arranged below the power semiconductors, whereas the printed circuit board is then arranged above the power semiconductors. In this case, the printed circuit board may cover the entire region in which the power semiconductors of the power module are arranged or may even extend laterally, i.e. transverse to the orthogonal direction, beyond this region.

The connection elements of the power semiconductors should then electrically contact the printed circuit board, in order to be able to receive electrical signals and/or electrical power via it, for example. For this purpose, connecting surfaces, which are electrically conductive and consist of metal, for example, are provided on the printed circuit board in a first variant on the surface directed toward the power semiconductors.

The connection elements can be electrically connected to connecting surfaces on the side of the printed circuit board facing the heat sink, for example. In this case, the connection elements running parallel to the printed circuit board can be attached to the connecting surfaces of the printed circuit board and can then be electrically connected to them, for example by soldering or welding. In particular, a method referred to as split head soldering can be used for this purpose, in the case of which the connection elements are pressed against the connecting surfaces and then an electrical current is conducted through them, by means of which heat is generated for melting a solder.

In one other variant of the invention, the printed circuit board has through holes. These through holes, also known as vias or via holes, have a metallization and in this case serve as connecting surfaces with which the connection elements of the power semiconductors are contacted (through-hole technology). The connection elements are then soldered into the through holes, for example.

According to one embodiment, the power module can further have a sealant which covers both the housed power semiconductors and at least partial regions of the printed circuit board against an environment.

Depending on operating conditions, it may be necessary to encapsulate components of the power module against an environment, in order to protect them, for example, against contact with surrounding fluid media or contamination, such as metal shavings, for example. Liquids such as water, for example, coming into contact with components of the power module should be avoided, for example, in order to avoid electrical short circuits and/or corrosion, for example. In particular in the case of applications in which a power module is to be used inside very aggressive media such as inside a gearbox flooded with aggressive oil, for example, the components of the power module should be tightly packed or encapsulated.

For this purpose, the power module can have a sealant which covers both the housed power semiconductors and at least partial regions of the printed circuit board against an environment. The sealant can consist of a material, for example, which can be used in liquid or viscous form and can subsequently be cured. For example, the sealant can be formed with a plastics material, in particular a thermosetting plastic, a thermoplastics material, a polymer and/or an elastomer. The sealant can be used by spraying, molding, casting or other processes, for example.

One other aspect of the invention is a method for producing a power module for controllable electrical power supply of a consumer. In this case, the method according to the invention comprises the following method steps:
a) providing a heat sink,
b) fitting one or a plurality of solder preforms onto a cooling surface of the heat sink,
c) fitting insulation plates onto the solder preforms,
d) fitting solder preforms onto the insulation plates,
e) fitting housed power semiconductors with the electrically non-insulated heat dissipation surface onto the solder preforms,
f) carrying out a soldering process in which the insulation plates are soldered to the housed power semiconductors and to the heat sink.

A solder preform consists of solder material and can be present in the form of a disc or as foil, for example. For positioning the preforms on the carrier, soldering frames can be used, for example, the geometry of which defines the position of the preform and the components which are to be soldered on the carrier. The geometry is therefore determined by the soldering frame, and these must be maintained accordingly when manufacturing different assemblies. However, it is also possible for a solder preform to be applied by means of SMD technology in steps c) and e).

In step f), the solder preforms between the insulation plates and the heat sink and the solder preforms between the insulation plates and the power semiconductor are soldered in one single soldering process.

In one variant of the invention, in step g), a printed circuit board is provided which is connected to the connection elements of the housed power semiconductors. The connection elements are electrically connected to the connecting surfaces in a simple manner during manufacturing of the power module, for example by being soldered to the connecting surfaces.

Exemplary embodiments of the invention are described in a detailed manner hereinafter with reference to the accompanying figures.

FIG. 3 shows a schematic sequence of the method according to the invention.

There reference numbers used in the figures and their meaning are listed in summary form in the list of reference numbers. In principle, identical or similar parts are provided with the same reference numbers. The figures are merely schematic and not to scale.

Figure 1:
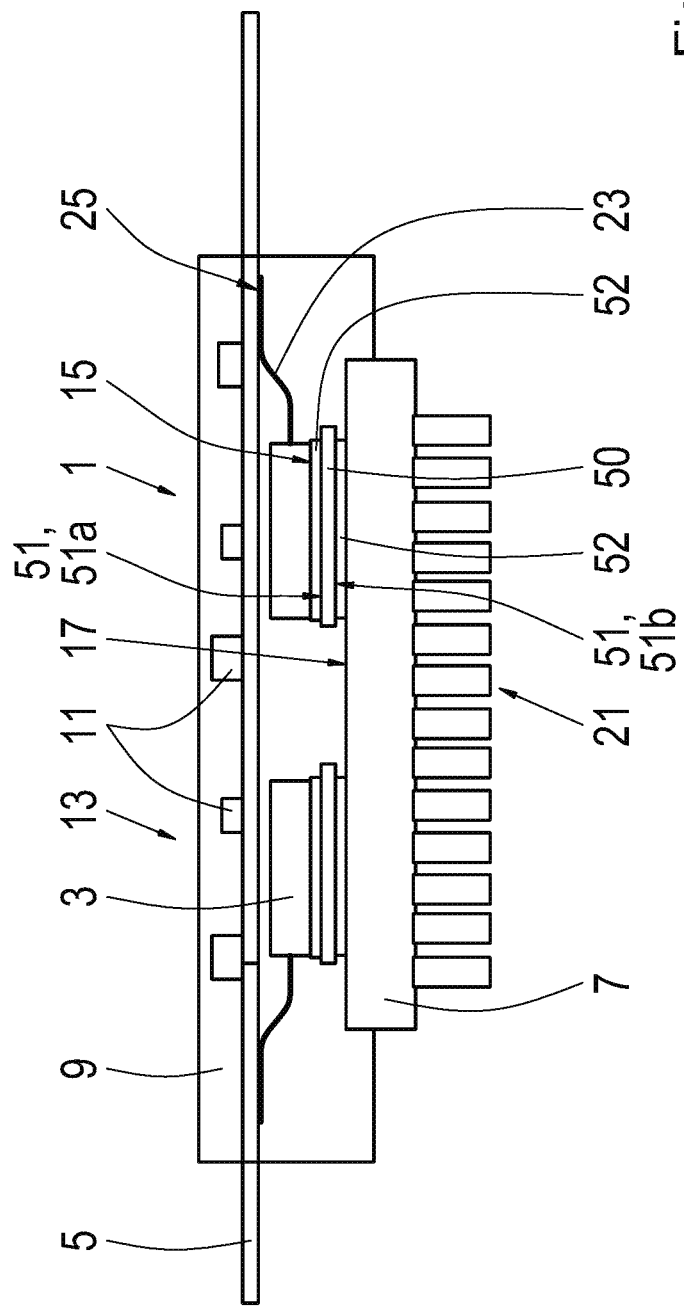
FIGS. 1 and 2 show sectional views through power modules according to different embodiments of the present invention.
Figure 2:
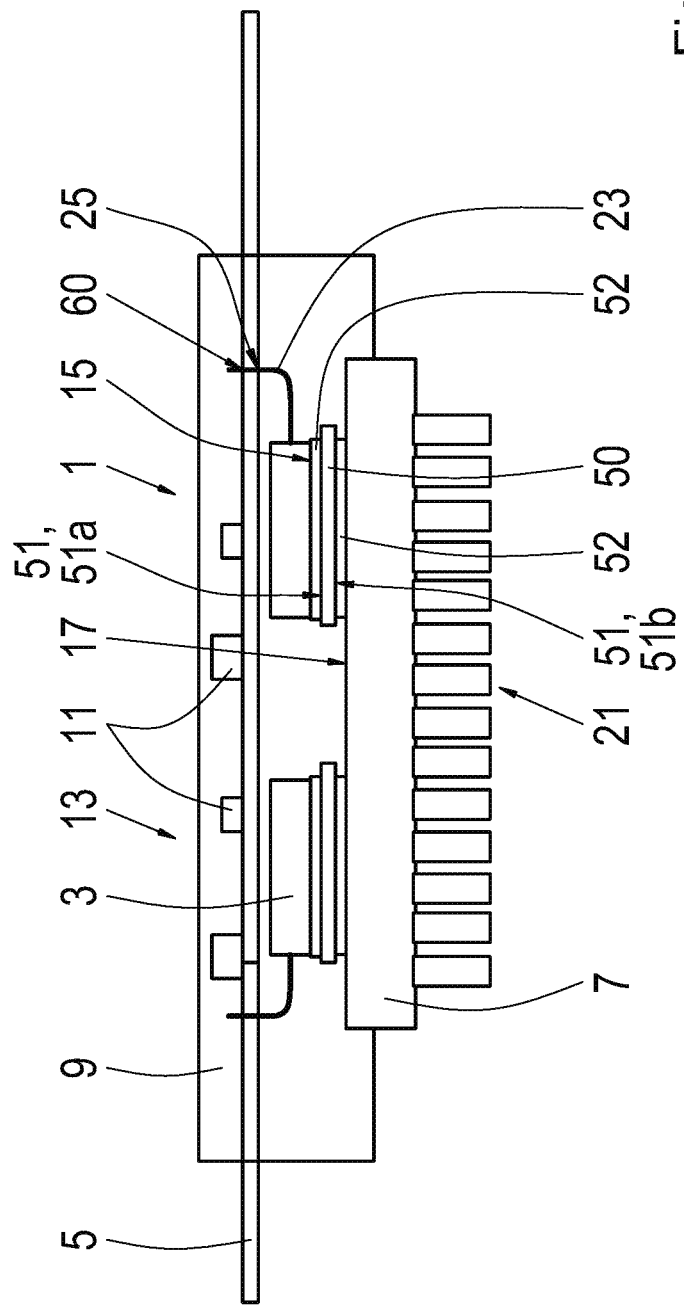

FIGS. 1 and 2 each show sectional views through a power module 1 for controllable electrical power supply of a consumer (not represented) such as an electric motor in an electrically driven vehicle, for example. FIG. 2 shows a sectional view through a slightly modified variant of the power module 1 from FIG. 1.

The power module 1 comprises a plurality of housed power semiconductors 3, a plurality of insulation plates 50, a printed circuit board 5, a heat sink 7, as well as a sealant 9. The heat sink 7 can be designed as a cooling plate made of a metal such as copper, for example, and may optionally possess cooling structures 21. Electrical and/or electronic components 11 are provided on the printed circuit board 5 which form a control circuit 13 for controlling the power semiconductors 3. Electrical power can, for example, be fed in from a battery via external connections (not represented) and then delivered, controlled by the power module 1, via other external connections (not represented), to motor phases of an electric motor, for example.

Each of the power semiconductors 3 has a heat dissipation surface 15 on its outer side directed toward the heat sink 7. On this heat dissipation surface 15, on the housed power semiconductor 3, a metallic surface or plate is provided, via which heat which is generated inside the housed power semiconductor 3, for example by a power-controlling semiconductor component located there such as an IGBT, a SiC or a power MOSFET, can be discharged.

In this case, the housed power semiconductors 3 each possess electrically conductive connection elements 23. The connection elements 23 are used to electrically connect power-controlling structures, for example in the form of semiconductor components inside the housed power semiconductors 3, in order to provide them with control signals and/or the electrical power which is to be controlled.

Each of the housed power semiconductors 3 is connected to an insulation plate 50. In this case, the insulation plate 50 is arranged between the housed power semiconductor 3 and the heat sink 7. The insulation plate 50 has a metallization 51 on an upper side 51a facing the housed power semiconductor 3 and on a lower side 51b facing the heat sink 7 respectively. Solder preforms 52 are further arranged between the metallization 51 and the housed power semiconductor 3 as well as between the metallization 51 and the heat sink 7 respectively.

The solder preforms 52 are thermally connected to the metallizations 51 on the respective sides 51a, 51b of the insulation plate 50. During a soldering process, on the one side 51a of the insulation plate 50, the solder preforms 52 connect the insulation plate 50 to the heat dissipation surface 15 of the power semiconductor 3. On the other side 51b of the insulation plate, the solder preforms 52 connect the insulation late 50 to the cooling surface 17 of the heat sink 7. The insulation plate 50 is therefore connected to the cooling surface 17 of the heat sink 7 in a thermally conductive manner. Furthermore, the heat dissipation surface 15 of the housed power semiconductor 3 is connected to the cooling surface 17 of the heat sink 7 in a thermally conductive manner via the insulation plate 50.

The printed circuit board 5 is arranged on a side of the power semiconductors 3 which is opposite in an orthogonal direction to the side on which the heat sink 7 is arranged. In other words, the power semiconductors 3 are located between the heat sink 7 and the printed circuit board 5.

The connection elements 23 of the power semiconductors 3 are arranged in such a way that the connection elements 23 electrically contact connecting surfaces 25 on the printed circuit board 5. In the embodiment represented in FIG. 1, the elongated connection elements 23 are arranged laterally adjacent to the power semiconductor 3 for this purpose and contact the connecting surfaces 25 there.

FIG. 2 shows a variant of the embodiment represented in FIG. 1. In order to avoid repetitions, only the changes to FIG. 1 are mentioned in the description of FIG. 2.

The printed circuit board 5 has through holes 60. These through holes 60, also referred to as vias or via holes, have a metallization and therefore serve as connecting surfaces 25 for the connection elements 23 of the power semiconductors 3, in addition to connecting surfaces 25 on the lower and/or upper side of the printed circuit board 5. In this case, the through holes 60 are designed in such a way that the connection elements 23 can reach through the printed circuit board 5. This makes it possible for the connection elements 23 to be able to be attached, for example soldered, to the connecting surfaces 25 on a side of the printed circuit board 5 which is opposite to the power semiconductors 3.

FIG. 3 shows a schematic sequence of the method according to the invention.

In a first method step S1, a heat sink 7 is provided. In a step S2, the cooling surface 17 of the heat sink 7 is subsequently fitted with one or a plurality of solder preforms 52. These solder preforms 52 are fitted with insulation plates 50 in a third step S3. In a fourth step S4, the insulation plates 50 are subsequently fitted with solder preforms 52. In a subsequent fitting step S5, the housed power semiconductors 3 with the electrically non-insulated heat dissipation surface 15 are arranged on the solder preforms 52.

In a subsequent soldering process S6, the solder preforms 52 are melted in such a way that the insulation plates 50 are soldered to the housed power semiconductors 3 and to the heat sink 7. As a result, a thermal connection between the heat dissipation surface 15 of the power semiconductors 3 and the heat sink 7 is achieved.

In a step S7, a printed circuit board 5 is provided and in a step S8, the connection elements of the housed power semiconductors are connected to the printed circuit board 5.

In addition, it should be noted that "comprising" does not exclude any other elements or steps and "a" does not exclude a multiplicity. It should further be noted that features or steps that have been described with reference to one of the previous exemplary embodiments can also be used in combination with other features or steps from other exemplary embodiments described previously. Reference numbers in the claims are not to be regarded as a limitation.

REFERENCE NUMBERS 1 power module
3 power semiconductor
5 printed circuit board
7 heat sink
9 sealant
11 components
13 control circuit
15 heat dissipation surface
17 cooling surface
21 cooling structures
23 connection elements
25 connecting surfaces
50 insulation plate
51 metallization
51a upper side of the insulation plate der
51b lower side of the insulation plate
52 solder preform
60 through hole
S1-S8 method steps

The invention claimed is:

1. A power module for controllable electrical power supply of a consumer, wherein the power module has:
   a plurality of housed power semiconductors each comprising an electrically non-insulated heat dissipation surface;
   a printed circuit board;
   a heat sink; and
   at least one insulation plate,
   wherein the printed circuit board is arranged on a side of the power semiconductors which is opposite to the heat sink in an orthogonal direction,
   wherein the at least one insulation plate is arranged between the housed power semiconductors and a cooling surface of the heat sink, wherein the at least one insulation plate is connected with one side to an electrically non-insulated heat dissipation surface of at least one housed power semiconductor of the plurality of housed power semiconductors in a form-fitting manner and is connected with another side to the heat sink in a form-fitting manner, and wherein the at least one insulation plate has an electrically conductive metallization on a side facing the at least one housed power semiconductor and on a side facing the cooling surface of the heat sink.

2. The power module as claimed in claim 1 wherein the at least one insulation plate is made of a ceramic.

3. The power module as claimed in claim 1 further comprising connection elements that electrically contact connecting surfaces on the printed circuit board and run parallel to the connecting surfaces.

4. The power module as claimed in claim 1 further comprising connection elements that electrically contact connecting surfaces in through holes of the printed circuit board.

5. The power module as claimed in claim 1, wherein the power module has a sealant which covers the plurality of housed power semiconductors and at least partial regions of the printed circuit board against an environment.

6. A method for producing a power module, the method comprising:
providing a heat sink;
fitting at least one first solder preform onto a cooling surface of the heat sink;
fitting at least one insulation plate onto the at least one first solder preform;
fitting at least one second solder preform onto the at least one insulation plate;
fitting at least one housed power semiconductor with an electrically non-insulated heat dissipation surface onto the at least one second solder preform; and
carrying out a soldering process in which the at least one insulation plate is soldered to the at least one housed power semiconductor and to the heat sink.

7. The method as claimed in claim 6, further comprising:
providing a printed circuit board that is connected to connection elements of the at least one housed power semiconductor.

8. The method as claimed in claim 7, wherein the connection elements run parallel to connecting surfaces of the printed circuit board.

9. The method as claimed in claim 7, wherein the connection elements electrically contact connecting surfaces of the printed circuit board in through holes of the printed circuit board.

10. The method as claimed in claim 7, further comprising:
covering the plurality of housed power semiconductors and at least partial regions of the printed circuit board against an environment a sealant.

11. The method as claimed in claim 6, wherein the at least one insulation plate has an electrically conductive metallization on a side facing the at least one housed power semiconductor and on a side facing the cooling surface of the heat sink.

12. The method as claimed in claim 6, wherein the at least one insulation plate is made of a ceramic.

* * * * *